United States Patent [19]

Soclof

[11] Patent Number: 5,043,787

[45] Date of Patent: Aug. 27, 1991

[54] EXTREMELY SMALL AREA NPN LATERAL TRANSISTOR

[75] Inventor: Sidney I. Soclof, San Gabriel, Calif.

[73] Assignee: Rockwell International Corporation, El Segundo, Calif.

[21] Appl. No.: 66,593

[22] Filed: Jun. 24, 1987

Related U.S. Application Data

[60] Continuation-in-part of Ser. No. 418,861, Sep. 16, 1982, abandoned, which is a division of Ser. No. 220,400, Dec. 29, 1980, Pat. No. 4,415,371.

[51] Int. Cl.$^5$ ...................... H01L 29/72; H01L 29/06
[52] U.S. Cl. ........................................ 357/35; 357/55
[58] Field of Search ........................... 357/23.5, 35, 55

[56] References Cited

U.S. PATENT DOCUMENTS 4,519,849 5/1985 Korsh et al. .
4,641,170 2/1987 Ogura et al. .

OTHER PUBLICATIONS

S. A. Evans et al., "A 1-Micron Bipolar VLSI Technology", *IEEE Transactions On Electron Devices*, vol. ED-27 (Aug. 1980) pp. 1373-1379.
S. Konaka et al., "A 30-ps Si Bipolar DC Using Super Self-Aligned Process Technology", *IEEE Transactions on Electron Devices*, vol. ED-33, No. 4 (Apr. 1986), pp. 526-531.

*Primary Examiner*—J. Carroll
*Attorney, Agent, or Firm*—H. Fredrick Hamann; George A. Montanye; Wilfred G. Caldwell

[57] ABSTRACT

An array of hundreds of devices may be simultaneously processed on a chip to sub-micron dimensions by establishing tiny active regions for each transistor surrounded by field oxide filled moats or slotted regions, wherein the slots are utilized to dope the substrate within the active region. The N type substrate is double energy boron planted through one surface to establish a P region to a given depth. This surface is oxidized and photoresist mask conventionally to open regions for the slots which are ion milled or ODE etched to a given depth. N+ regions are established by the slots by ion implanting at an angle such that the entire depth of the slot is not doped but rather the doping is confined to a region within the double energy P implanted depth. Drive-in diffusion enlarges the N+ areas for the emitter and collector and oxidation fills the moat insulating regions around the active area. The oxide is stripped and the P region enhanced to P+ at the surface, with silox being deposited and opened for metal contacts to the P+ region for the base and the emitter and collector region. The doping profile of the base region provides a potential barrier to minimize the flow of electrons toward the surface because the emitter electrons are channeled through the less heavily doped part of the base region to the collector.

2 Claims, 10 Drawing Sheets

EXTREMELY SMALL AREA NPN LATERAL TRANSISTOR

CROSS REFERENCE

This application is a continuation-in-part of Ser. No. 06/418,861 filed 1982 now abandoned, which is a division of Ser. No. 06/220,400 filed Dec. 29, 1980 now U.S. Pat. No. 4,425,371, by the same inventor.

FIELD OF THE INVENTION

The invention comprises a tiny transistor and process for manufacturing the same, utilizing doping of the active region via boundary slots, subsequently filled with field oxide, to isolate each transistor of an array on a chip.

BACKGROUND OF THE INVENTION

The prior art has dimensionally resolved sub-micron fabrication techniques comparable to or even smaller than the thicknesses of thermally grown silicon oxide layers on silicon. Also, the dimensions are now comparable to or even smaller than the base widths used for double diffused transistors, e.g., approximately 0.4–1.0 micrometers. Drawing from these techniques, a unique process and device in the form of a lateral NPN bipolar transistor comprises the subject of this invention.

SUMMARY OF THE INVENTION

An NPN lateral transistor in an N-doped substrate having an active region surrounded by field oxide in which N+ doped portions region serve as the emitter and collector and a doped region comprises the base. The P doping is achieved by implanting the upper level of the substrate with P doping material and the N doping is achieved by implanting the slot walls above the P depth with N doped material. The latter is driven in, the slots are filled with field oxide and contacts are made to the three electrodes.

BRIEF DESCRIPTION OF THE DRAWINGS

FIGS. 26–40 disclose yet another alternative method for forming the contacts;

DESCRIPTION OF THE PREFERRED EMBODIMENT

A preferred method for forming the novel sub-micron dielectrically isolated NPN bipolar transistor is set forth in connection with the following figures, but it will be realized that certain steps may be substituted such as the slots may be ion milled or ODE etched provided that the surface being attacked is (110). Similarly, doping may be accomplished in various ways, as is conventionally known. However, certain features of the present process uniquely form the subject invention, e.g., the double energy boron implant, illustrated in FIG. 1 employs a high energy and a low energy implanting step to convert the upper portion of the N-type substrate 11 to P-type shown at 13.

Figures 1, 2:
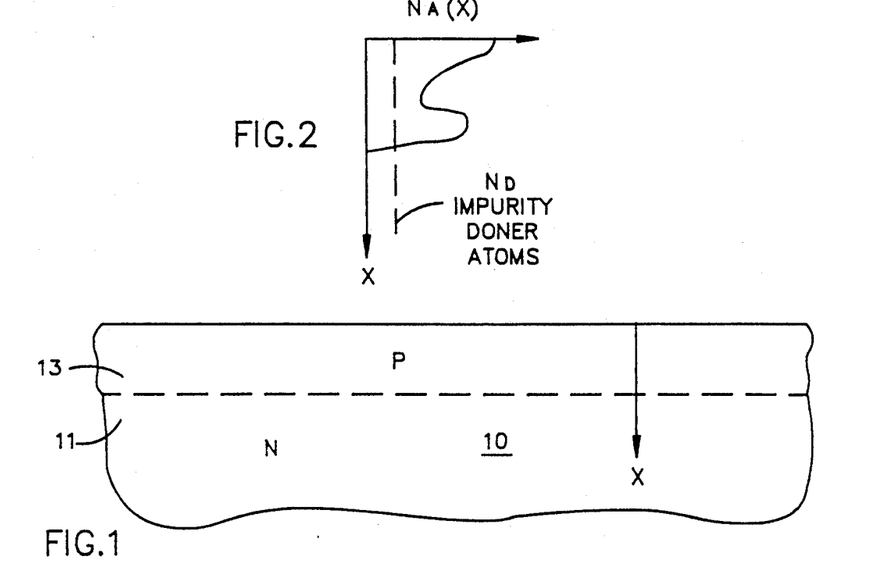
FIG. 1 is a view of a portion of a substrate to show the double energy boron implant for the P region.
FIG. 2 is a diagram of distance of penetration and boron acceptor concentration.

Reference to FIG. 2, shows the double energy distribution of boron acceptors versus the distance of implant illustrated on the axis marked X with $N_D$ indicating the impurity donor atoms constant concentration.

Figure 3:
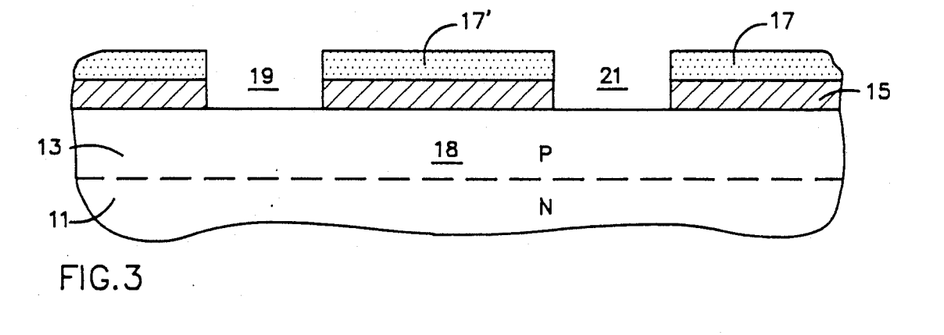
FIG. 3 shows the boron implanted substrate oxidized, and patterned, using a photoresist and mask, to outline the moat or slots or recesses surrounding the protective active region for a single transistor.

In FIG. 3, the substrate 11, conventionally doped, e.g., $10^{15}$ to $10^{16}$ per cm$^3$, has been oxidized, as shown by the silicon oxide layer 15, covered with a photoresist layer 17 and masked, exposed to actinic radiation, and the soluble portions of the photoresist dissolved, along with removal of the silicon oxide layer 15 therebeneath, as shown in the regions 19 and 21. Regions 19 and 21 are opened to the substrate 11 in order that the slots 23 and 25 of FIG. 4 may be formed therein. The photoresist portion 17' covers the active region 18 of the transistor being formed.

Figure 4:
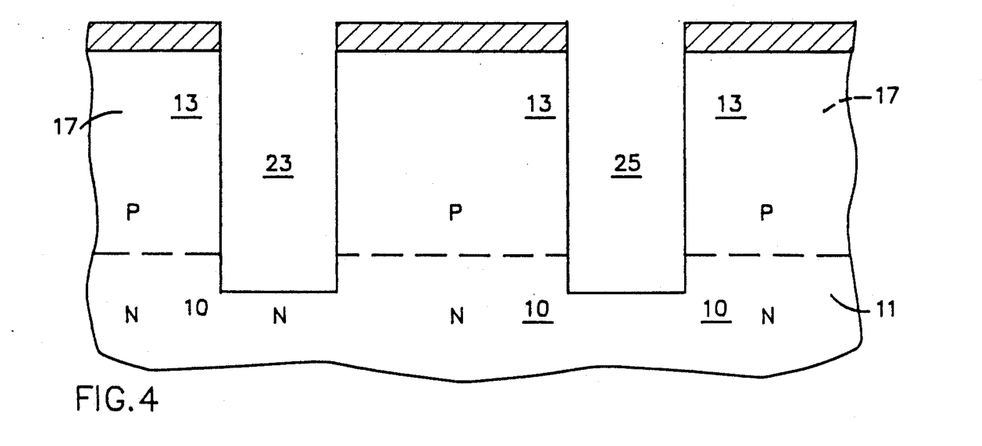
FIG. 4 shows the slots or boundary moats or recesses formed into the substrate.

In FIG. 4, the slots 23 and 25 are made by ion milling or ODE etching with, e.g., KOH provided that the upper surface of the substrate is (110). It should be noted that the depth of the slots 23 and 25 is deeper than the P region and extends into the N region 10 of the substrate 11.

Figure 5:
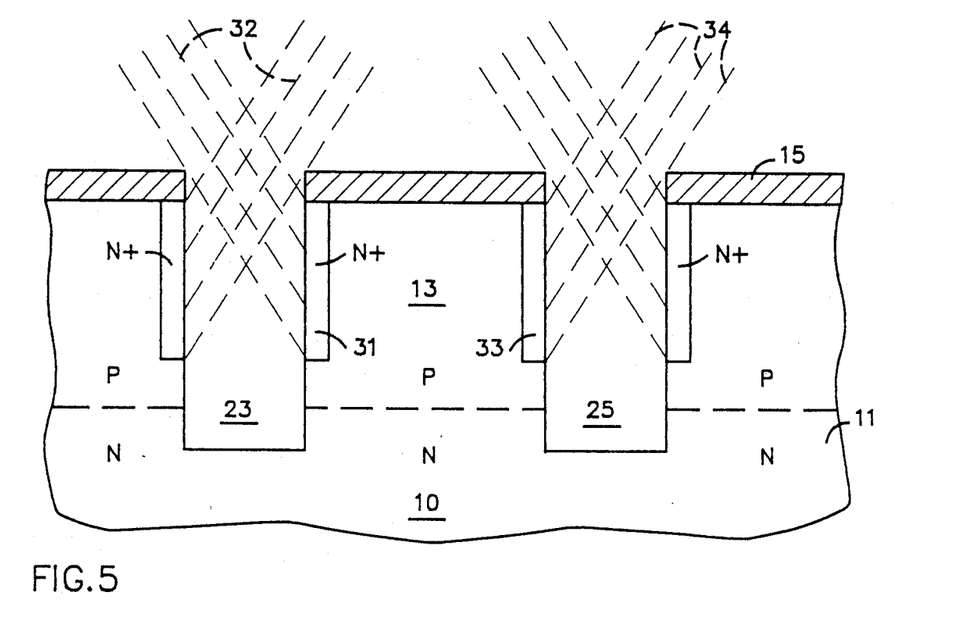
FIG. 5 illustrates the step of ion implanting the N+ regions at an angle to the direction of the slots in order that only the upper portion of the slots are doped.

In FIG. 5, it may be seen that the N+ regions 31 and 33 are implanted by ion implanting at an angle, as illustrated by the ion beams 32 and 34. A conventional dose of $5 \times 10^{15}$ per cm$^2$ at 100 KV will suffice, for example. It is important to note that the angle of the ion beams relative to the slot directions is such that the N+ implanting does not extend to the full depth of the slots 23 and 25. Actually the corners of the silicon oxide layer 15 form a shadowing effect and cooperate with the orientation of the beam 32 and 34 in fixing the N+ doped regions within the P region 13. Phosphorus or other donors may be employed in this step.

Figure 6:
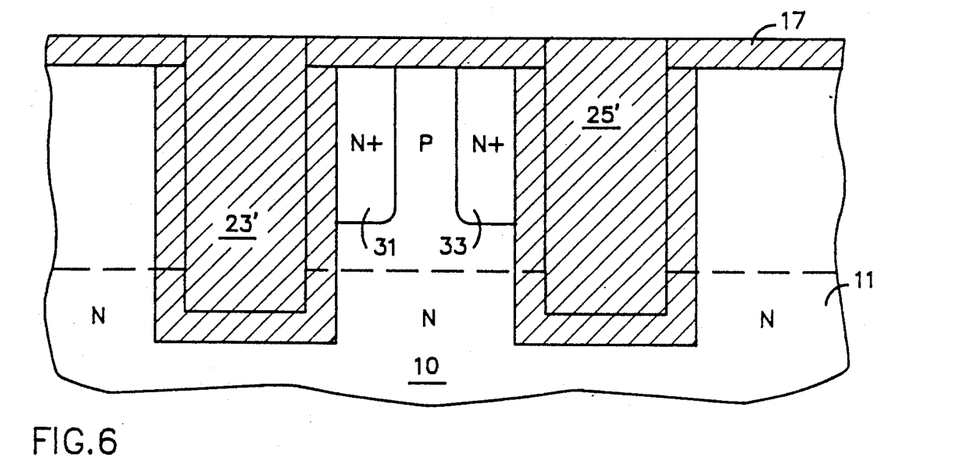
FIG. 6 shows the structure of FIG. 5 after the N+ doping has been driven in and following an oxidation step which fills in the slots.

In FIG. 6, it may be seen that the doping has been driven in and the N+ regions 31 and 33 considerably enlarged. This may be accomplished through the application of heat over a controlled period of time and temperature. The next step, also illustrated in FIG. 6, is the growing of oxide 23' and 25' in the slots 23 and 25 to provide an insulating barrier around the active region where the transistor is being formed. It will be noted that the silicon oxide grows both into the substrate 11, but principally outwardly to fill the slots, as shown at 23' and 25'.

Figure 7:
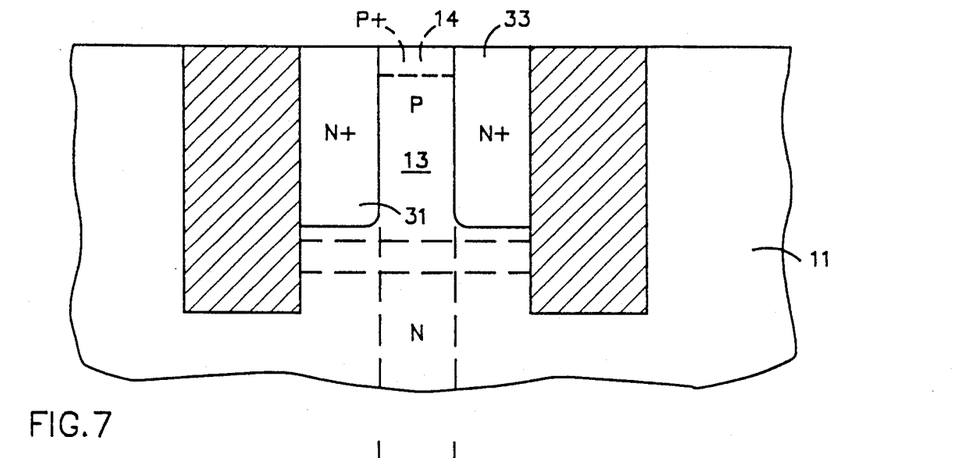
FIG. 7 illustrates the enhanced P+ boron implanted region following oxide stripping and prior to deposition of silox and opening the same for metal contact.

Referring now to FIG. 7, the silicon oxide is stripped from the substrate 11 and boron is implanted to enhance the P region 13 as shown by the P+ in the surface region 14. A dose of $2 \times 10^{15}$ per cm$^2$ per cm at 30 KV, e.g., is used. Then, a silox deposition is made to cover the entire chip and openings are provided through the silox layers to make contact with the N+ region 31 to serve as the emitter, N+ region 33 as the collector and P+ region 14 as the base.

Figure 8:
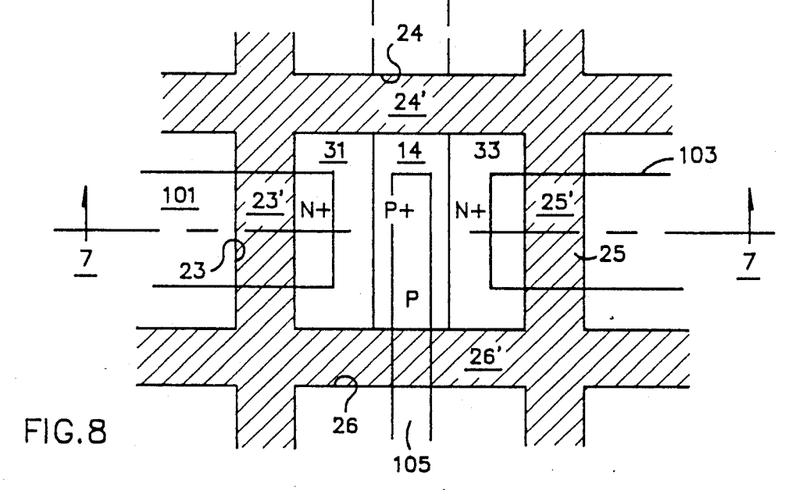
FIG. 8 is a view in top plan of the single transistor formed within the surrounding boundary silicon oxide insulation and additionally showing the metal connections to the emitter base and collector.

This is better shown in FIG. 8 wherein the emitter electrode comprises a metal layer 101 extending over the N+ region 31, the collector electrode is shown at 103 in electrical connection with N+ region 33 and the P+ or base electrode is shown at 105 in contact with P+ region 14. It may also be appreciated that the slots 23 and 25 are visible, shown filled with the silicon oxide 23' and 25'. Also, the rest of the boundary comprises the slots 24 and 26 filled with silicon oxide 24' and 26' thereby completing the surrounding of the transistor active area with insulation. It may also help to note that the cross-sectional plane of FIG. 7 is taken along the plane 7—7 of FIG. 8 and it is for this reason that the slots 24 and 26 were not visible in previous figures.

Figures 8A, 9A, 9B:
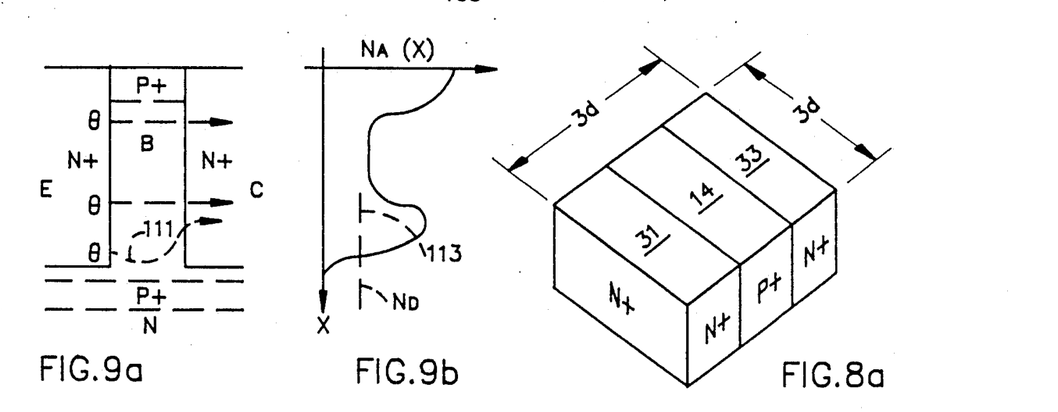
FIG. 8a is a view in perspective of the transistor, per se.
FIGS. 9a and 9b show the doping profile of the base region in the transistor to illustrate a potential barrier minimizing the flow of electrons toward the surface and also toward the substrate with the chart illustrating the channeling obtained less heavily doped part of the base region to the collector.

FIG. 8a shows the transistor, per se, and it may be appreciated that there is no waste—it is all useful, and therefore the tiniest possible structure.

Referring now to FIGS. 9a and 9b, the doping profile of the base region 14 may be seen to be such that a potential barrier is set up to minimize the flow of electrons upwards toward the surface of substrate 11 and also downwards toward the substrate, as shown in FIG. 9a, by electron path 111.

This gradient that influences the electron flow is occasioned by the double energy boron implantation with the distribution shown in FIG. 9b wherein the horizontal axis is illustrated by $N_A$ wherein the N and the A are both caps (x) to indicate the boron acceptors and the vertical axis is indicated by the little x, indicating distance of penetration with dotted line 113 showing impurity donor atoms $N_D$.

The electrons emitted by emitter 31 are essentially channeled through the less heavily doped part of the base region 14 to the collector 33. This feature also allows for a high current gain (beta) and also for operation at very low current levels.

Advantages presented by the invention are the fact that the parasitic component of the junction capacitances between collector and base and emitter and base has been almost completely eliminated. Also, the base spreading resistance is greatly reduced since the base contact is directly over the active portion of the base region. Only the parasitic base to substrate capacitance is not substantially reduced.

The principles of the present invention are compatible with use of the Perkin Elmer Projection Printer equipment for 2 micron dimensions, the 10:1 stepper for 1 micron rated dimensions, and electron beam or X-ray lithography for under 1 micron dimensions.

An alternative method for forming contacts, particularly to very small dimensions, is set forth in FIGS. 10-25.

Figure 10:
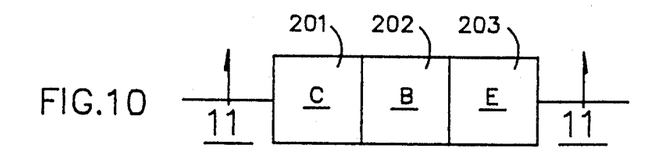
FIG. 10 is a view in top plan of a bipolar device of the type of FIG. 7 without the oxide overlay.

In FIG. 10, the collector, base and emitter 201, 202 and 203 are depicted in a lateral arrangement, as seen in top plan. Doping of these elements has been accomplished as described through FIG. 10.

Figure 11:
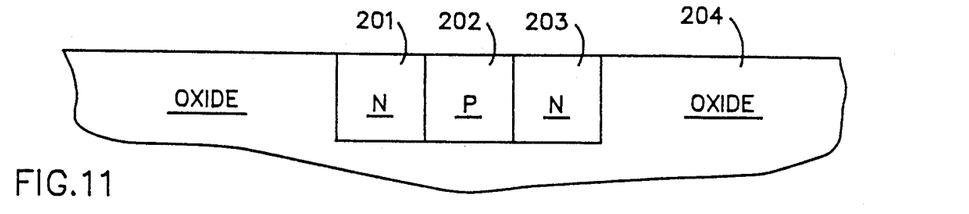
FIG. 11 shows the device of FIG. 10 in cross-section in field oxide.
Figure 12:
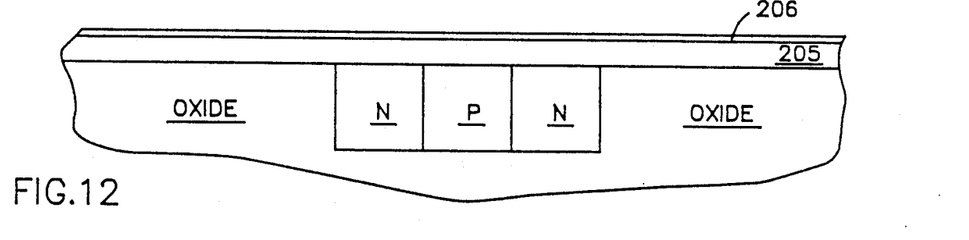
FIG. 12 shows the application of a polysilicon layer covered by a nitride layer to the structure of FIG. 11.

In FIG. 11, the collector 201 is shown as being N doped, the base 202 is P doped and the emitter 203 is N doped, all surrounded by oxide.

The first step in building sub-micron contacts for these devices is to deposit undoped polysilicon to approximately 5000 angstroms or less for such diminutive contacts. This step may be applied to the structure of FIG. 7. The contact doping steps of FIGS. 18 and 20 would, of course, be switched for a PNP device.

Returning to FIG. 12, a layer 206 of nitride is deposited to a thickness of approximately 1000 angstroms over layer 205.

Figure 13:
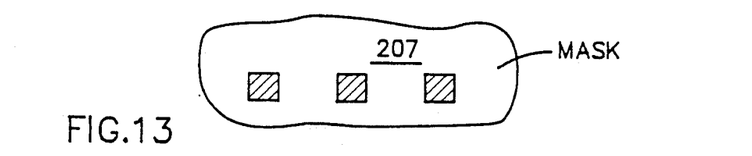
FIG. 13 shows a contact mask.
Figure 14:
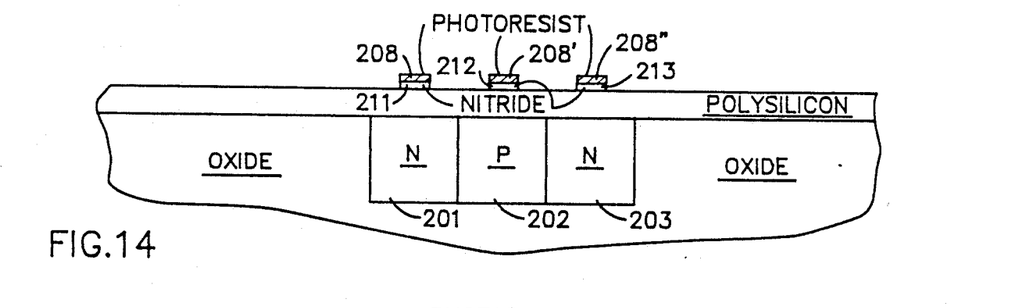
FIG. 14 shows the nitride buttons remaining over each of the bipolar elements atop the polysilicon layer.

The mask 207 of FIG. 13 is employed with photoresist 208 to delineate the nitride 206, thereby leaving the nitride buttons 211, 212 and 213 over the collector 201, base 202 and emitter 203 respectively (FIG. 14).

Figure 15:
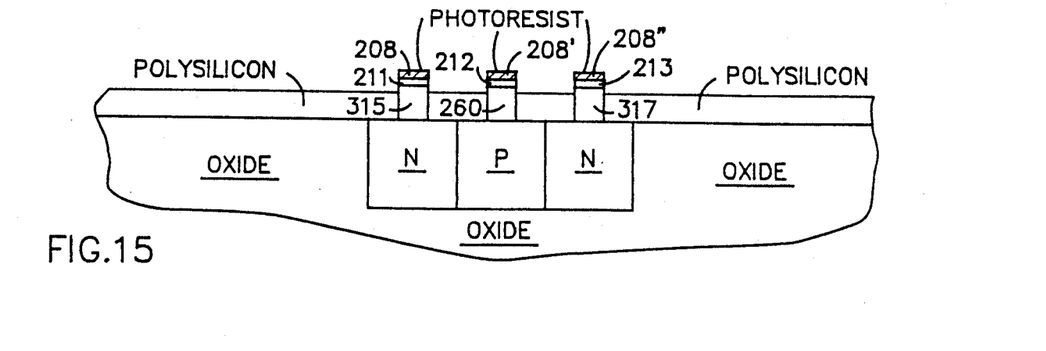
FIG. 15 shows the etching away. of approximately ½ of the polysilicon layer prior to oxidation.

To insure ultimate planarization, a portion of the polysilicon is etch removed (FIG. 15). This may comprise 2500 angstroms of polysilicon. A non-selective or anisotropic etch is employed so that only the polysilicon is removed.

Figure 16:
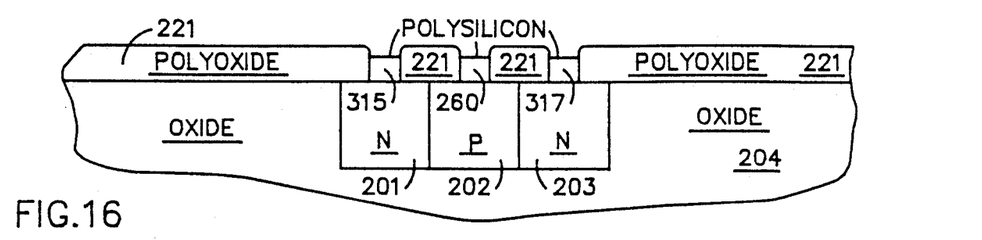
FIG. 16 shows the polysilicon layer converted to polyoxide except where the nitride buttons preserved the polysilicon.

Next, the resist 208, 208' and 208" is stripped and the polysilicon is then oxidized to become polyoxide 221, shown in FIG. 16. The nitride buttons 211, 212 and 213 are removed using a selective or wet etch conventional step. The polyoxide 221 also fills in the spaces between the contacts 315, 260 and 317 and rises slightly above the contacts to insulate them.

FIG. 16 shows the structure after the nitride buttons 211, 212 and 213 have been removed.

Figure 17:
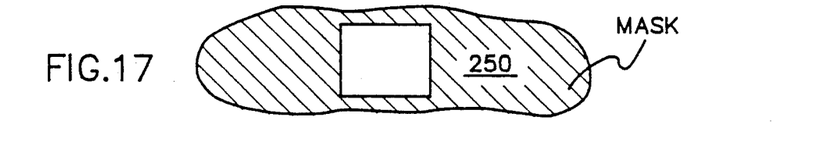
FIG. 17 shows the mask for opening regions to the base electrode polysilicon.
Figure 18:
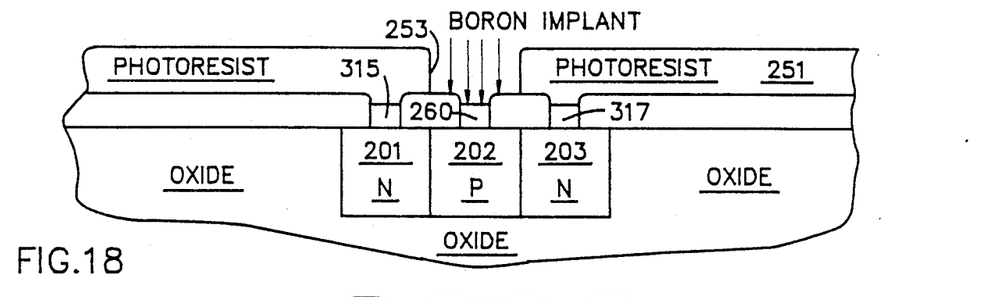
FIG. 18 shows the boron implant to achieve the doping of the polysilicon electrode.
Figure 19:
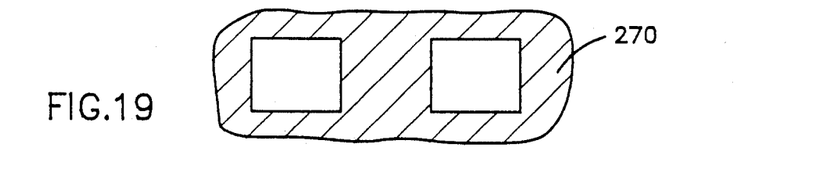
FIG. 19 shows a mask for opening regions to the collector and emitter (N regions)

In FIG. 17, mask 250 is used, together with photoresist 251, to open aperture 253 to the P doped base 202, (FIG. 17) for boron implanting into the base electrode 260 to insure contact to base 202. Implanting is carried out using a 60 Kev implanter with a 1 to $5 \times 10^{15}$ ions per cm$^2$ dose.

Figure 20:
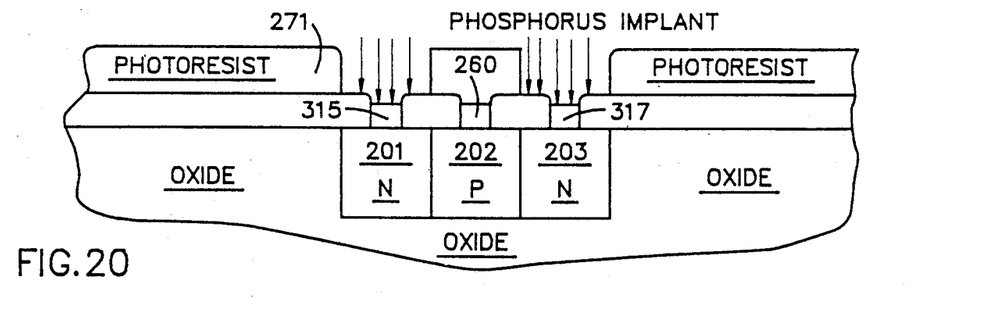
FIG. 20 shows these regions opened and the polysilicon therein being doped by phosphorus implant.

Next, the photoresist 251 is stripped and a new layer 271 applied for use with the mask 270 (FIG. 19) to open the new layer of photoresist 271 above the collector 201, and emitter 203. The phosphorus ions are implanted, the photoresist 271 is stripped and the device of FIG. 20 is annealed for the implants at 800° C. for 40 minutes in a nitrogen atmosphere.

Figure 21:
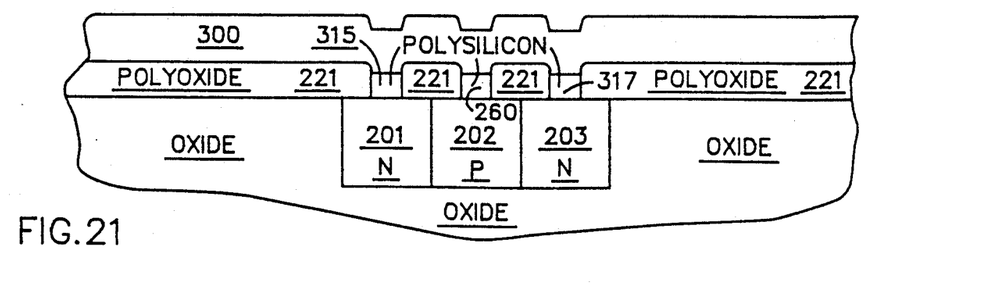
FIG. 21 shows the nitride buttons removed and the layer of metal over top of the structure.
Figures 22, 23:
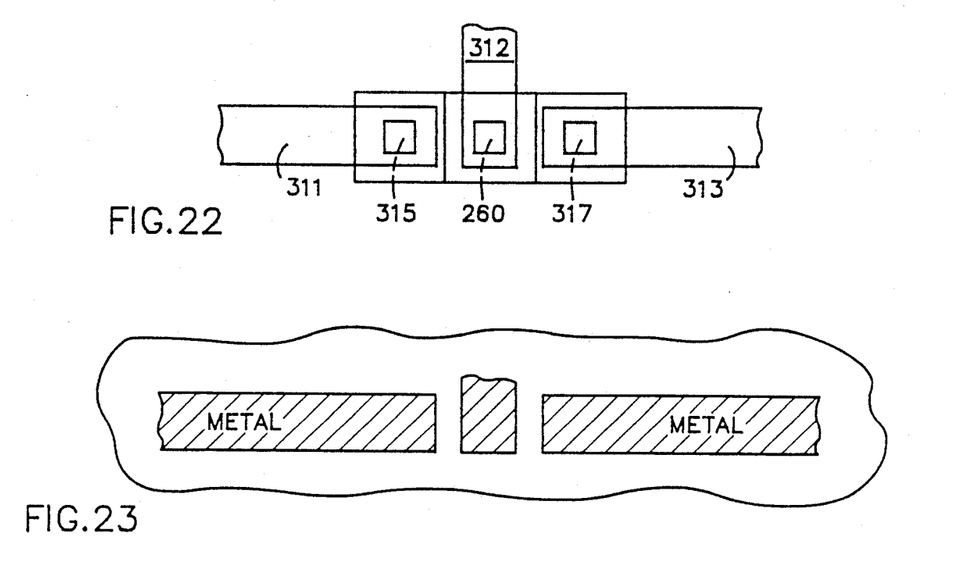
FIG. 22 shows the arrangement in top plan view as delineated by the mask of FIG. 23.

In FIG. 21, a metal layer 300 has been applied over the structure de 221 and other structure and the metal mask of FIG. 23 is applied, and the metal is etched to provide a metal interconnect 311 (FIG. 22) to the doped poly electrode 315 of collector 201, interconnect 312 to the doped poly electrode 260 of base 202 and interconnect 313 to the doped poly electrode 317 of emitter 203.

Figure 24:
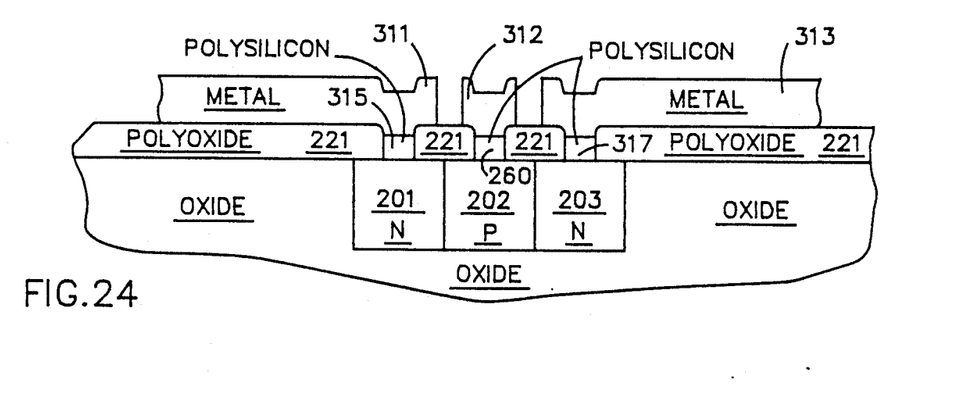
FIG. 24 shows the completed device following sintering.

FIG. 24 shows a completed device.

Figure 25:
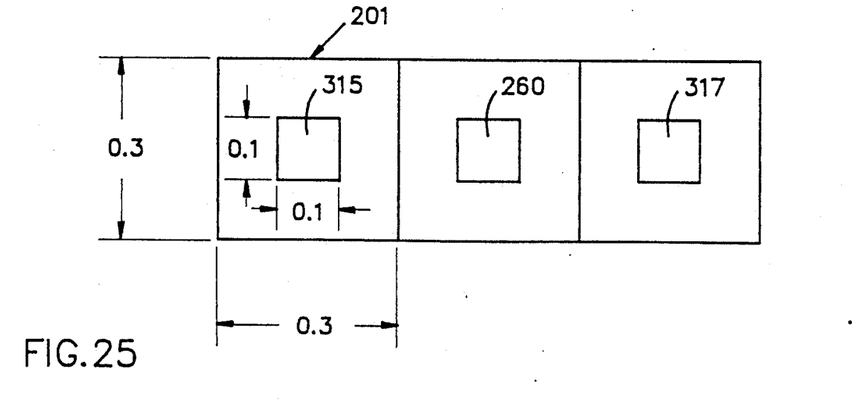
FIG. 25 shows dimensions achievable in the contact region for these devices, the elements, such as the collector 201 measuring 0.3 by 0.3 microns and the contact regions, such as 315 measuring 0.1 by 0.1 microns.

FIG. 25 shows relative sizes for the bipolar device, the elements themselves, such as the collector, measuring 0.3 by 0.3 microns and the contact regions, measuring 0.1 by 0.1 microns.

Figure 26:
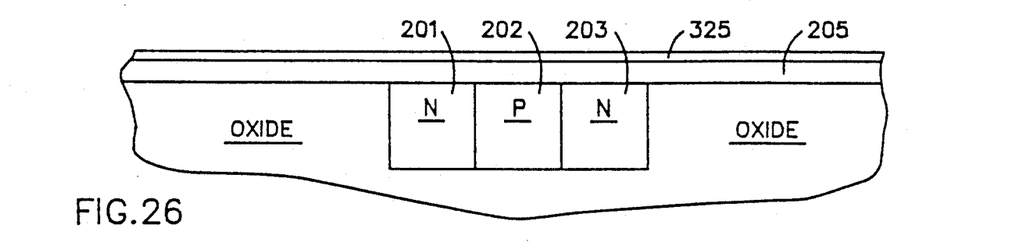
FIG. 26 shows the NPN elements of a transistor being formed embedded in oxide and covered by a layer of polysilicon, in turn covered by a layer of nitride.
Figure 27:
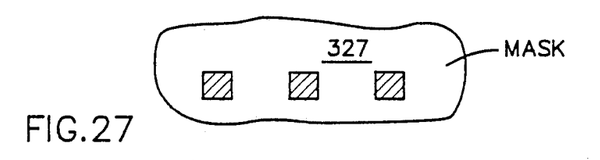
FIG. 27 is a contact mask.
Figure 28:
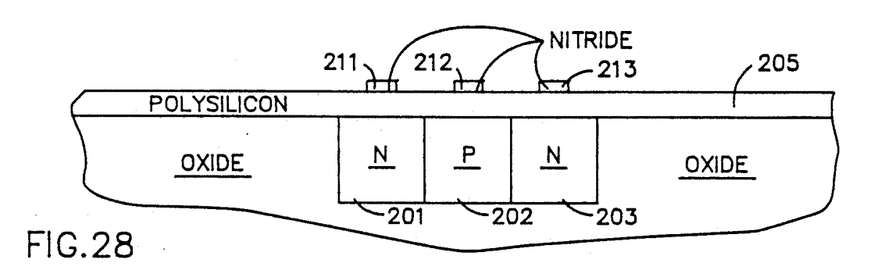
FIG. 28 shows the nitride contact buttons.

Yet another alternative method for forming the contacts is disclosed, beginning with FIG. 26 wherein the three elements collector 201, base 202 and emitter 203 are first covered by polysilicon 205 to a depth of, e.g., approximately 3000 angstroms, and nitride 325 is deposited to a depth of, e.g., approximately 1000 angstroms. Mask 327 serves to form the nitride buttons 211, 212 and 213 (the same as before). These nitride buttons 211-213 are preferably centered over the collector 201, base 202 and emitter 203 as seen in FIG. 28, although considerable leeway is available for any misalignment, as is apparent from FIG. 40.

Figure 29:
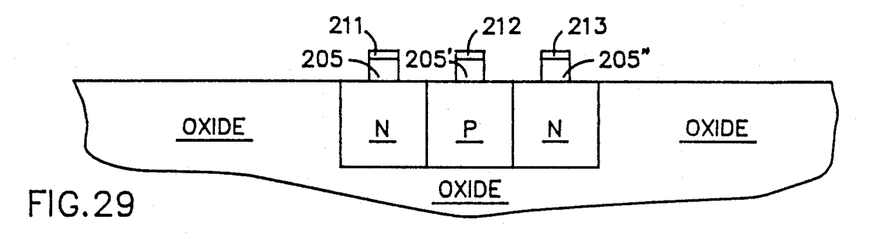
FIG. 29 depicts the isolated polysilicon contacts.

In FIG. 29, the unprotected polysilicon 205 is removed in conventional manner, such as by etching to leave undoped polysilicon contacts 205, 205', and 205".

Figure 30:
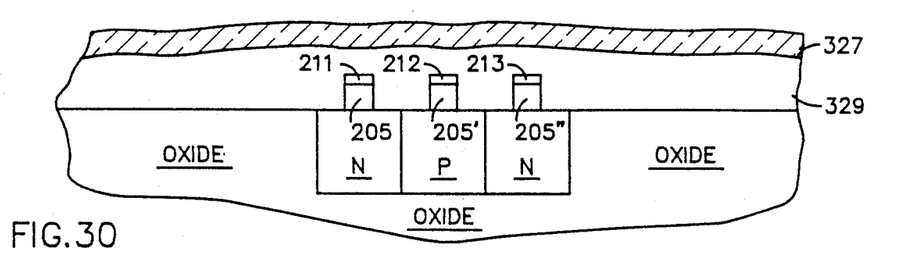
FIG. 30 reveals the plasma oxide covering the contacts, and in turn covered by glass (SOG)

In FIG. 30, plasma oxide 329 is deposited using the conventional planarization process to a depth of approximately 3000 angstroms. This step is followed by spinning on glass 327 (SOG) so as to look substantially planar.

Figure 31:
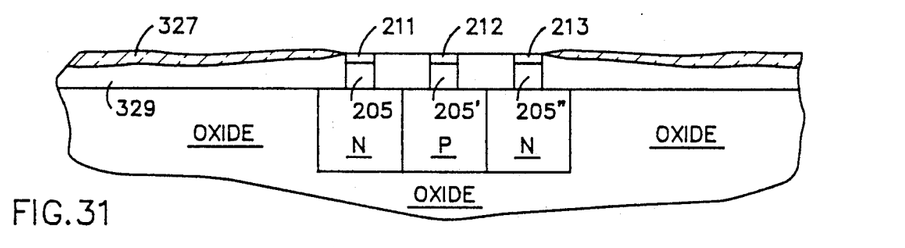
FIG. 31 planarizes the structure of FIG. 30 down to the tops of the nitride buttons.

In FIG. 31, a reactive ion etching (RIE) conventional step is carried out for effecting planarization which exposes the nitride buttons 211, 212 and 213 and is terminated approximately at the level of the tops of these buttons.

Figure 32:
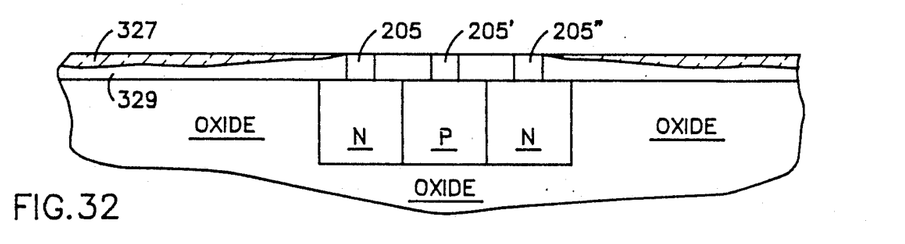
FIG. 32 shows the structure of FIG. 31 with the nitride buttons removed.

In FIG. 32, the nitride buttons 211, 212 and 213 have been removed from the contacts 205, 205' and 205" using a conventional step to prepare the contacts for doping to make them properly conductive.

Figure 33:
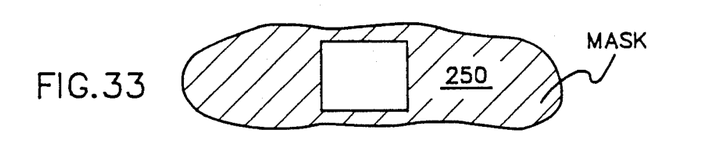
FIG. 33 shows the mask to be used in making a doping opening to the base contact.
Figure 34:
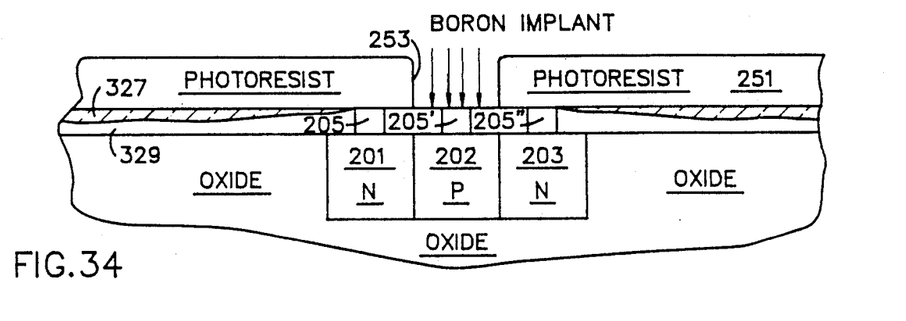
FIG. 34 shows the doping step for the base contact.

In FIG. 33, mask 250 is shown for delineating photoresist 251, in the previous manner, to provide the opening 253 for the boron implant, as shown by the arrows in FIG. 34.

Figure 34A:
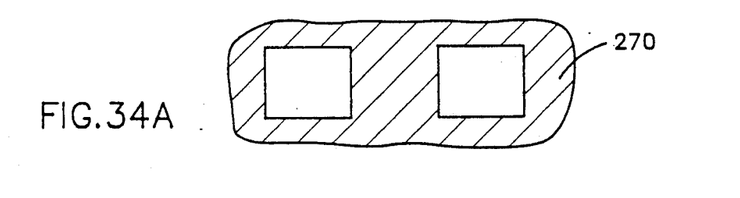
FIG. 34A shows a mask for making openings to the collector and emitter contacts.
Figure 35:
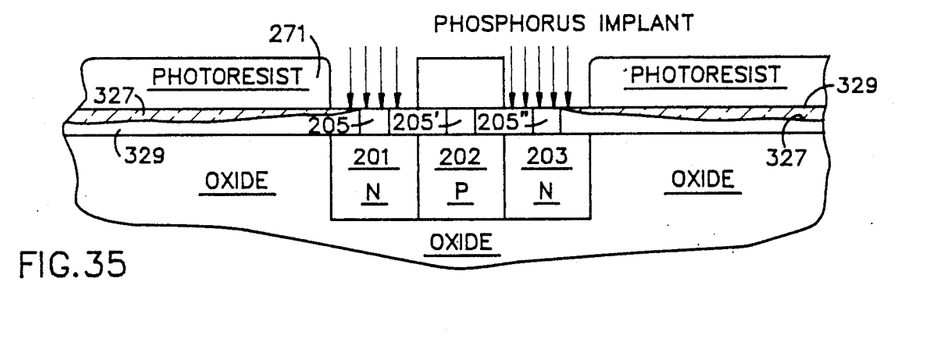
FIG. 35 shows the doping step for the collector and emitter contacts.

In similar fashion, mask 270 of FIG. 34a, is again utilized to delineate the photoresist 271 for the phosphorus implants, shown by the arrows (FIG. 35), thereby concluding the doping of the three polysilicon contacts 205, 205' and 205" in the same N or P doping as their underlying collector, base and emitter.

Figure 36:
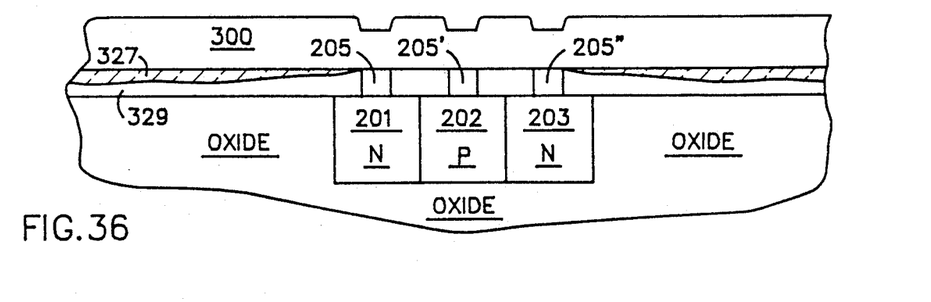
FIG. 36 includes the metal interconnect layer.
Figure 37:
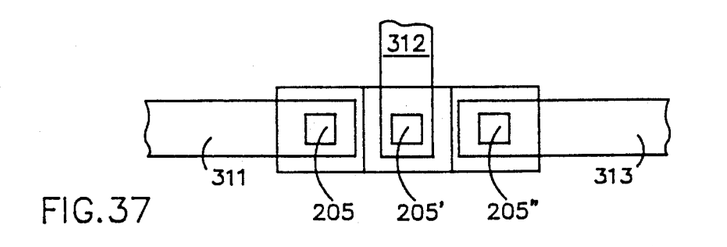
FIG. 37 shows the delineated metal interconnects.
Figure 38:
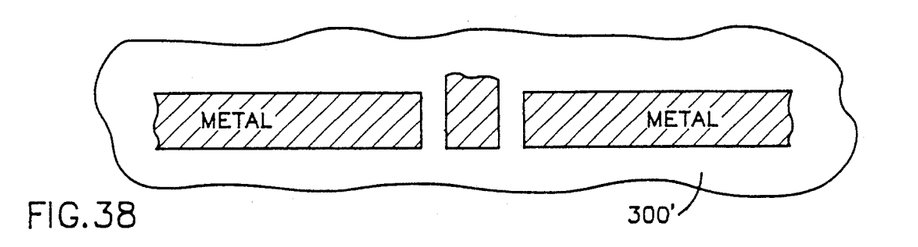
FIG. 38 shows the mask for effecting the delineation.

In FIG. 36, the metal layer 300 has been applied over this structure, and the metal mask of FIG. 38, shown at 300', is used and the metal is etched to provide the metal interconnects 311 (FIG. 37) to the doped poly electrode 205 of collector 201, interconnect 312 to the doped poly electrode 205' of the base 202 and interconnect 313 to the doped poly electrode 205" of emitter 203.

Figure 39:
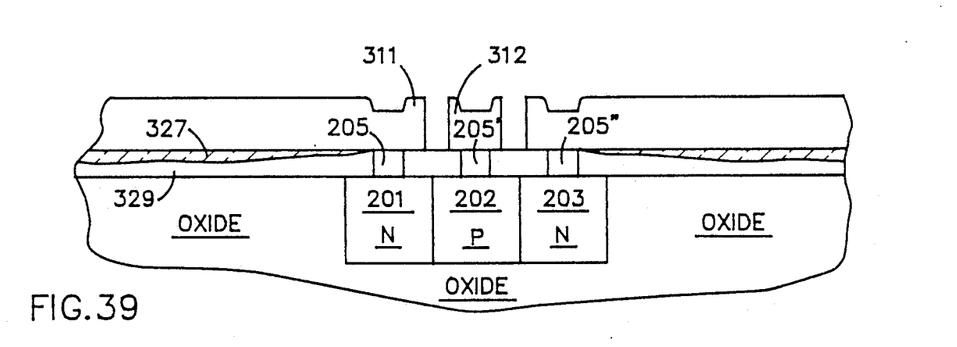
FIG. 39 shows the completed device.

FIG. 39 shows the completed device made in this fashion.

Figure 40:
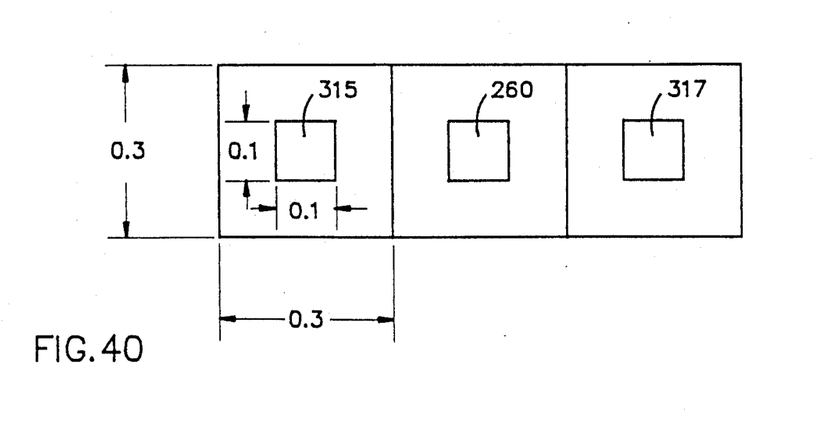
FIG. 40 is an example of relative sizes available from this method.

Finally, FIG. 40 shows, by way of example, relative sizes for the bipolar device, the elements themselves such as the collector measuring 0.3 by 0.3 microns and the contact regions measuring 0.1 by 0.1 microns.

The use of an E-beam fabricator, guided by the masks successively used herein, makes the VLSI contacts of the order of these sub-micron dimensions. Of course, larger contacts might be readily utilized.

If desired, single MOS or bipolar devices may be made, and it is only necessary to insulate them by isolation, usually in lieu of the field oxide, illustrated.

This method is also applicable to MOS, GaAs and conventional bipolar minimal size contacts obtained down to 0.1×0.1 microns, or to 0.1 micron diameter where the spot size is 0.1 micron, or up to 1 micron sizes or larger.

In summary, the following advantages are achieved by this invention:

1. Sub-micron contact technology.
2. Contact integrity without the need of excessive silicon content in the metal or contact barriers such as Titanium Nitride, etc..
3. Planar structures without severe steps to hinder metal step coverage, or restrictions for proximity of contact to vias to gates, thereby improving packing density.
4. Principle applicable to MOS (NMOS, PMOS, CMOS, etc.), Bipolar devices and GaAs technologies.
5. Contact technology compatible with shallow junctions and other state of the art processes such as selective silicides.
6. Minimum overlap of metal for interconnects.
7. Via overlap of contact realizable with this technique.

What is claimed is:

1. An array of sub-micron dimensioned NPN lateral transistors formed in a substrate doped N-type, each comprising, in combination:
   a P-doped substrate region within and adjacent a surface of the substrate as a result of double energy implanting in the substrate to a given depth;

spaced apart slots in the substrate through said surface penetrating said substrate region and extending to a depth below said given depth through which N+ type dopins is selectively received into the adjacent substrate regions, said N+ doping limited to a depth less than said given depth;

said received N+ doping respectively extending into the P region less than one half of the distance between adjacent slots as a result of drive-in;

said slots filled with field oxide and surrounding each region where a transistor will be formed;

said N+ doping on the inner sides of spaced apart slots within said regions comprising emitter and collector electrode areas;

said P doping enhanced to P+ areas adjacent said surface only between the emitter and collector electrode areas to comprise along with the P doped substrate region between said emitter and collector regions, a base electrode area; and, a contact to each N+ and P+ electrode area with each contact measuring approximately 0.1 micron across.

2. The array of claim 1 wherein:

said spaced apart slots comprise first pairs of spaced apart substantially parallel slots orthogonally intersected by further pairs of spaced apart substantially parallel slots;

said selective N+ doping being confined to the inner sides of opposed walls of said first pairs of slots; and, each transistor occupying the space between intersecting pairs of slots and measuring approximately 3d by 3d where d=0.4 microns.

* * * * *

UNITED STATES PATENT AND TRADEMARK OFFICE
CERTIFICATE OF CORRECTION

PATENT NO. : 5,043,787

DATED : August 27, 1991

INVENTOR(S) : Sidney I. Soclof

It is certified that error appears in the above-identified patent and that said Letters Patent is hereby corrected as shown below:

Column 7, line 4, please change "dopins" to read --doping--.

Signed and Sealed this

Twenty-ninth Day of December, 1992

Attest:

DOUGLAS B. COMER

Attesting Officer     Acting Commissioner of Patents and Trademarks